United States Patent
Ramappa

(10) Patent No.: US 8,507,298 B2
(45) Date of Patent: Aug. 13, 2013

(54) PATTERNED IMPLANT OF A DIELECTRIC LAYER

(75) Inventor: Deepak A. Ramappa, Somerville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 97 days.

(21) Appl. No.: 13/310,318

(22) Filed: Dec. 2, 2011

(65) Prior Publication Data
US 2013/0143353 A1   Jun. 6, 2013

(51) Int. Cl.
*H01L 21/00* (2006.01)

(52) U.S. Cl.
USPC ............................................ 438/19; 438/756

(58) Field of Classification Search
USPC ............ 438/19, 430, 754, 756; 257/E21.491
See application file for complete search history.

(56) References Cited

U.S. PATENT DOCUMENTS

| | | | |
|---|---|---|---|
| 4,592,129 A | 6/1986 | Legge | |
| 6,077,744 A * | 6/2000 | Hao et al. | 438/268 |
| 6,080,663 A * | 6/2000 | Chen et al. | 438/637 |
| 6,933,232 B2 | 8/2005 | Chopra | |
| 7,339,110 B1 | 3/2008 | Mulligan et al. | |
| 7,737,357 B2 | 6/2010 | Cousins | |
| 7,820,460 B2 | 10/2010 | Sullivan et al. | |
| 7,883,343 B1 | 2/2011 | Mulligan et al. | |
| 7,897,867 B1 | 3/2011 | Mulligan et al. | |
| 8,372,737 B1 | 2/2013 | Bateman et al. | |
| 2005/0158666 A1* | 7/2005 | Liu et al. | 430/314 |
| 2009/0308439 A1 | 12/2009 | Adibi et al. | |
| 2011/0104618 A1 | 5/2011 | Bateman et al. | |

OTHER PUBLICATIONS

J. North et al., Tapered Windows in Phosphorus-Doped SiO2 by Ion Implantation, IEEE Trans. on Electron Devices, Jul. 1978, vol. ED-25, No. 7, pp. 809-812, IEEE.

G.V. Borzakova & I.Y. Mittova, Chemical Etching of Dielectric Films Prepared by Thermal Oxidation of Silicon Doped with Phosphorus, Arsenic, Antimony, and Boron Ions, Inorganic Materials. Feb. 1990, vol. 26, No. 2, abstract only.

* cited by examiner

*Primary Examiner* — William D Coleman

(57) ABSTRACT

At least part of a dielectric layer is implanted to form implanted regions. The implanted regions affect the etch rate of the dielectric layer during the formation of the openings through the dielectric layer. Metal contacts may be formed within these openings. The dielectric layer, which may be $SiO_2$ or other materials, may be part of a solar cell or other device.

18 Claims, 7 Drawing Sheets

PATTERNED IMPLANT OF A DIELECTRIC LAYER

FIELD

This invention relates to ion implantation and, more particularly, to ion implantation of dielectric layers.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Interdigitated backside contact (IBC) solar cells are one of the highest efficiency solar cells currently on the market. For example, a homojunction IBC solar cell may have greater than 24% efficiency. However, these and other high-efficiency solar cells typically have high manufacturing costs, which may be one reason that widespread adoption has not yet occurred.

Patterning of the solar cell is one contributing cost. Lithography steps are expensive and time-consuming. The consumables involved with lithography, such as photoresist, developers, hardmasks, and chemicals for etching or stripping, likewise are expensive. Any reduced cost to the manufacturing of high-performance solar cells would have a positive impact on the implementation of solar cells worldwide. This will enable the wider availability of high-efficiency solar cells as a clean energy technology. Therefore, what is needed is an improved method of ion implantation into dielectric layers. More particularly, what is needed is an improved method of ion implantation into dielectric layers used in the manufacture of solar cells.

SUMMARY

According to a first aspect of the invention, a method of manufacturing a workpiece is provided. The method comprises forming a dielectric layer over a doped region of a workpiece. A patterned implant into the dielectric layer is performed whereby a plurality of implanted regions are formed. The dielectric layer is selectively etched to form a plurality of openings. The doped region of the workpiece is exposed through the openings. A metal layer is applied to the doped region through these openings.

According to a second aspect of the invention, a method of manufacturing a solar cell is provided. The method comprises implanting a solar cell to form a plurality of n-type regions and implanting the solar cell to form a plurality of p-type regions. A dielectric layer is formed over the n-type regions and the p-type regions. A patterned implant into the dielectric layer is performed whereby a plurality of implanted regions are formed. The implanted regions are selectively etched to form a plurality of openings. At least one of the n-type regions and at least one of the p-type regions of the solar cell are exposed through the openings. Metal contacts are applied to at least one of the n-type regions and at least one of the p-type regions through these openings.

According to a third aspect of the invention, a method of manufacturing a solar cell is provided. The method comprises implanting a solar cell to form a plurality of n-type regions and implanting the solar cell to form a plurality of p-type regions. A dielectric layer is formed over the n-type regions and the p-type regions. A patterned implant into the dielectric layer is performed whereby a plurality of implanted regions are formed. The implanted regions are etched to form a plurality of openings. At least one of the n-type regions and one of the p-type regions of the solar cell are exposed through the openings. A blanket metal layer is formed over the dielectric layer and in the openings. A portion of the blanket metal layer is removed from the dielectric layer such that the blanket metal layer remains in the openings. Metal contacts are formed on the blanket metal layer in the openings.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments herein are described in connection with an IBC solar cell, but can be applied to selective emitter (SE) or other solar cell architectures known to those skilled in the art. Beam-line ion implanters, plasma doping ion implanters, flood ion implanters, implanters that create a focused ion beam, or ion implanters that modify a plasma sheath may be used for ion implantation. Other systems and processes involved in semiconductor manufacturing or other systems that use ions also may be used. While these embodiments are described with reference to solar cells, a similar process can be applied to semiconductor devices, light emitting diodes (LEDs), flat panel displays, or other workpieces. Thus, the invention is not limited to the specific embodiments described below.

Figure 1:
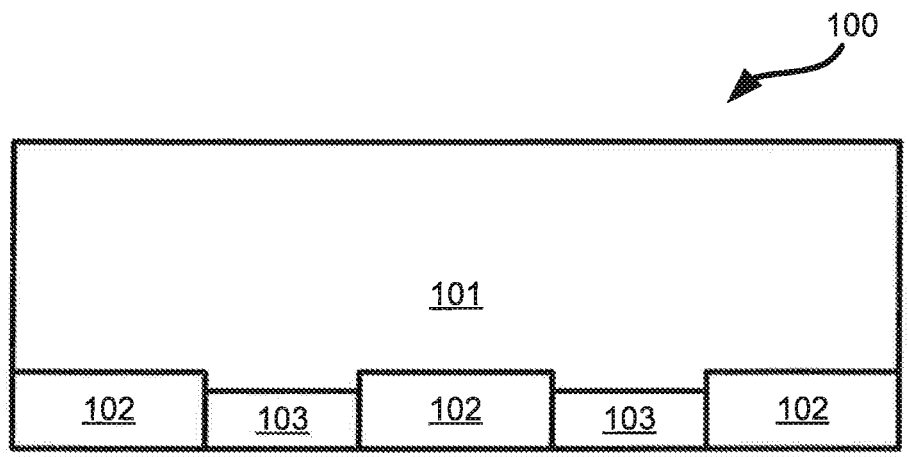
FIGS. 1-7 are cross-sectional views of an embodiment of solar cell manufacturing.

FIGS. 1-7 are cross-sectional views of an embodiment of solar cell manufacturing. In FIG. 1, the solar cell 100, which in this instance is an IBC solar cell, has p-type regions 102 and n-type regions 103 in the base 101. The p-type regions 102 and n-type regions 103 may be disposed on the surface of the base 101 opposite the surface impinged by light. The base 101 may be doped.

In one instance, the n-type regions 103 and p-type regions 102 may be implanted using two patterned implants. These patterned implants may use one or more masks disposed on the solar cell 100 or a distance from the solar cell 100 during implantation. These patterned implants also may use a method without a mask, such as using a focused ion beam or by modifying a plasma sheath. One skilled in the art will recognize other methods of doping the n-type regions 103 and p-type regions 102, such as furnace diffusion, laser doping, or counterdoping using ion implantation.

The solar cell 100 may be textured prior to formation of the n-type regions 103 and p-type regions 102 in order to reduce reflectivity. This texturing may be performed using an acid solution, alkali solution, plasma, or other methods known to those skilled in the art.

The solar cell 100 may be annealed after formation of the n-type regions 103 and p-type regions 102. This anneal may activate the dopants in the p-type regions 102 and the n-type regions 103. The anneal also may remove any damage to the crystal lattice of the solar cell 100.

Figure 2:
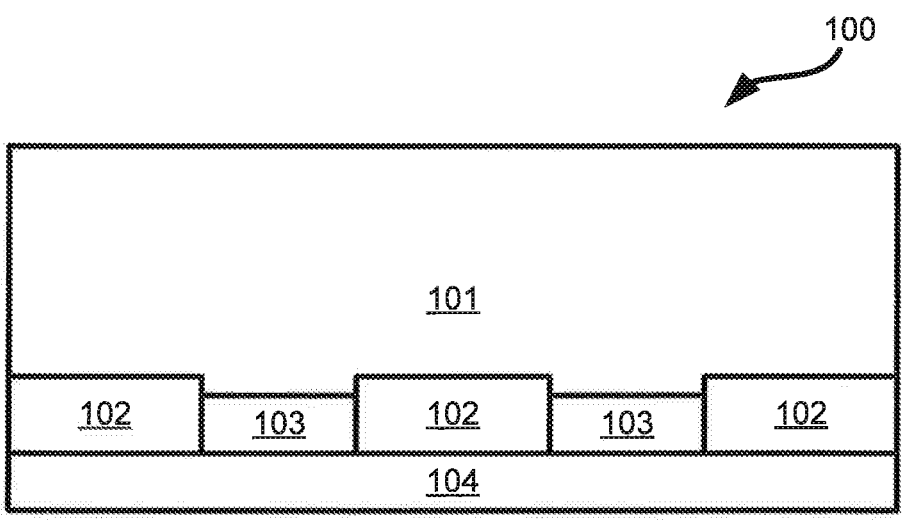
Figure 3:
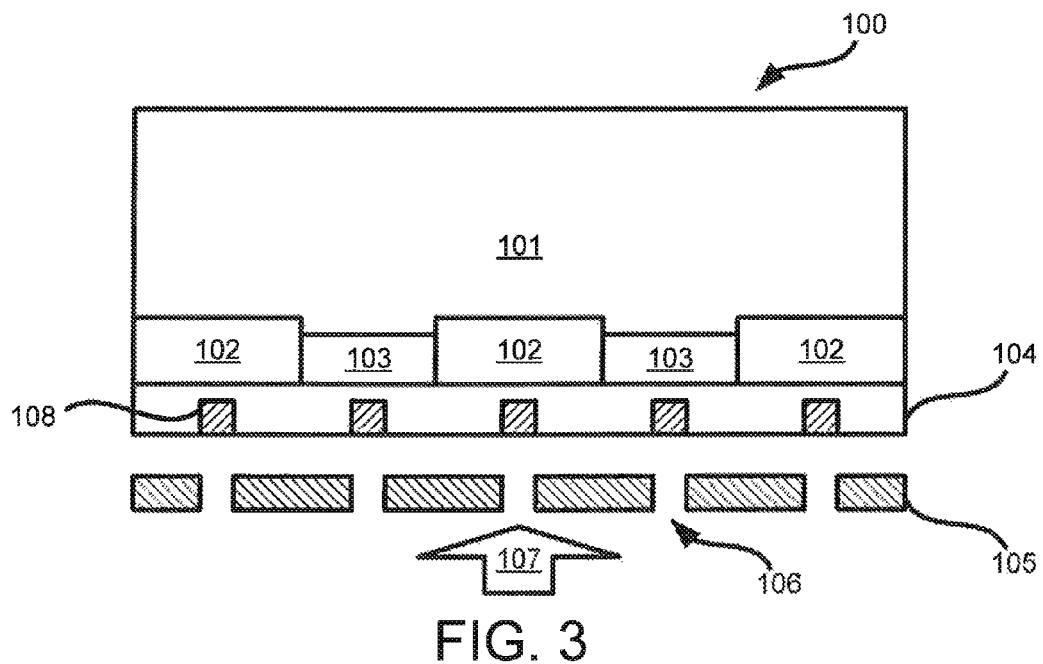

In FIG. 2, a dielectric layer 104 is formed on the solar cell 100. This dielectric layer 103 is disposed on the p-type regions 102 and n-type regions 103 of the solar cell 100 and may serve as an oxidation or passivation layer. While p-type regions 102 and n-type regions 103 are illustrated in FIG. 3, depending on the architecture of the solar cell the dielectric layer 104 may only be disposed on a doped layer of one type (i.e., either p-type or n-type). The dielectric layer 104 may be, for example, $Al_2O_3$, $SiO_2$, $SnO_2$, $TiO_2$, indium tin oxide (ITO) or other conductive oxides, some other oxide, a nitride, amorphous Si, a combination of these materials, or another dielectric material known to those skilled in the art. In one particular embodiment, the dielectric layer 104 is grown during a thermal oxide step.

A patterned implant into the dielectric layer 104 is performed in FIG. 3. In this particular embodiment, the dielectric layer 104 is implanted with ions 107 using a mask 105 with apertures 106. The mask 105 is disposed a distance from the solar cell 100 during the implantation. This implantation forms implanted regions 108 (partially shaded in FIG. 3). The implanted regions 108 may correspond to the apertures 106 in the mask 105.

The ions 107 may be, for example, B, $BF_2$, P, As, other n-type or p-type dopants, a noble gas, N, F, another halogen, or other species known to those skilled in the art. The ions 107 may change the physical or chemical characteristics of the dielectric layer 104. The ions 107 may be implanted in one instance with a dose of approximately $5E15$ $cm^{-2}$, though other implant doses are possible. The implanted regions 108 may be denser than other regions of the dielectric layer 104. The implanted regions 108 may be denser due to, for example, the presence of the ions 107 or the change in the crystal structure of the implanted regions 108 caused by the implant.

The thickness of the dielectric layer 104 formed in FIG. 2 may depend on the ions 107 used in FIG. 3. For example, if the ions 107 are As, then the dielectric layer 104 may only be approximately 100 Å thick. In another example, if the ions 107 are B, then the dielectric layer 104 may be thicker, such as approximately 0.5 μm. Of course, other thicknesses are possible and these thicknesses are merely listed as examples. The dielectric layer 104 thickness may depend on the ions 107 because the size of the ions 107 affects how deep into the dielectric layer 104 these ions 107 will penetrate at a given implant energy.

Figure 4:
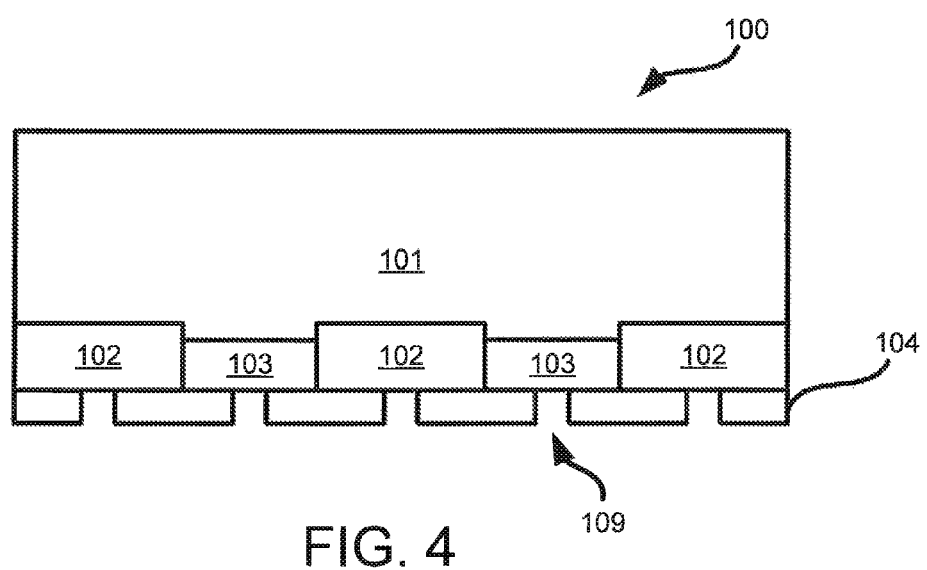

In FIG. 4, the dielectric layer 104 is chemically etched. The implanted regions 108 may be selectively etched or etched at a faster rate than the rest of the dielectric layer 104. This forms openings 109 in the dielectric layer 104. These openings 109 may correspond to the implanted regions 108 in FIG. 3. While the overall thickness of the dielectric layer 104 is reduced by the etch, the openings 109 expose the n-type regions 103 and p-type regions 102. Thus, some of the dielectric layer 104 remains after the etch process. If the etch rate and approximate thickness of the dielectric layer 104 is known, then the duration of the etch can be calculated such that the openings 109 are formed without removing more of the dielectric layer 104 than desired.

Some doped or implanted dielectrics will etch at a faster rate than a dielectric that is not doped or implanted. For example, $SiO_2$ etches in a 15:1 HF solution at 160 Å/min. In one experiment doped $SiO_2$ etched at the following rates: 900 Å/min when doped with $5E15$ $cm^{-2}$ B, 1140 Å/min when doped with $2E15$ $cm^{-2}$ $BF_2$, 1080 Å/min when doped with $5E15$ $cm^{-2}$ As, and 1020 Å/min when doped with $5E15$ $cm^{-2}$ P. Thus, all the doped or implanted $SiO_2$ samples etched faster in this experiment than the undoped or non-implanted $SiO_2$ sample. Other dielectric materials besides $SiO_2$ likewise may etch faster if doped.

The difference in etch rates for doped or implanted dielectrics may be based on the dopant species used or the implant dose. The physical change between the implanted regions 108 and the rest of the dielectric layer 104 in FIG. 3 may be one mechanism that causes increased etching in FIG. 4 because amorphized areas will etch differently than areas with different crystal structures. If a particular dopant is used, a chemical change to the dielectric layer 104 also may be a mechanism that causes increased etching. For example, some dopants in the dielectric layer 104 may form an acid during the etching process. If the ions 107 are P, then $H_3PO_4$ will form during a water rinse or during an etch when HF is used. If the ions 107 are F, then HF will form during a water rinse.

Figure 5:
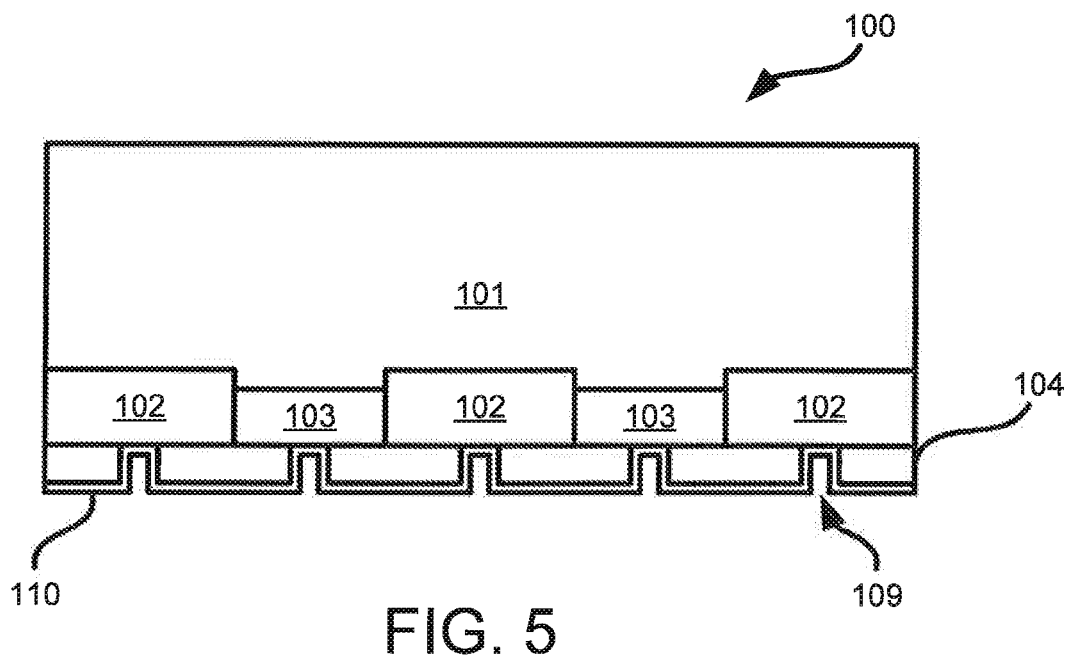

At least one blanket metal layer 110 is applied to some of the surface or the entire surface of the solar cell 100 in FIG. 5. This blanket metal layer 110 may be a metal seed formed by, for example, physical vapor deposition (PVD), evaporation, or electroplating. The blanket metal layer 110 is applied across the dielectric layer 104 and on the n-type regions 103 and p-type regions 102 through the openings 109. This blanket metal layer 110 may have a varying thickness across the surface.

Figure 6:
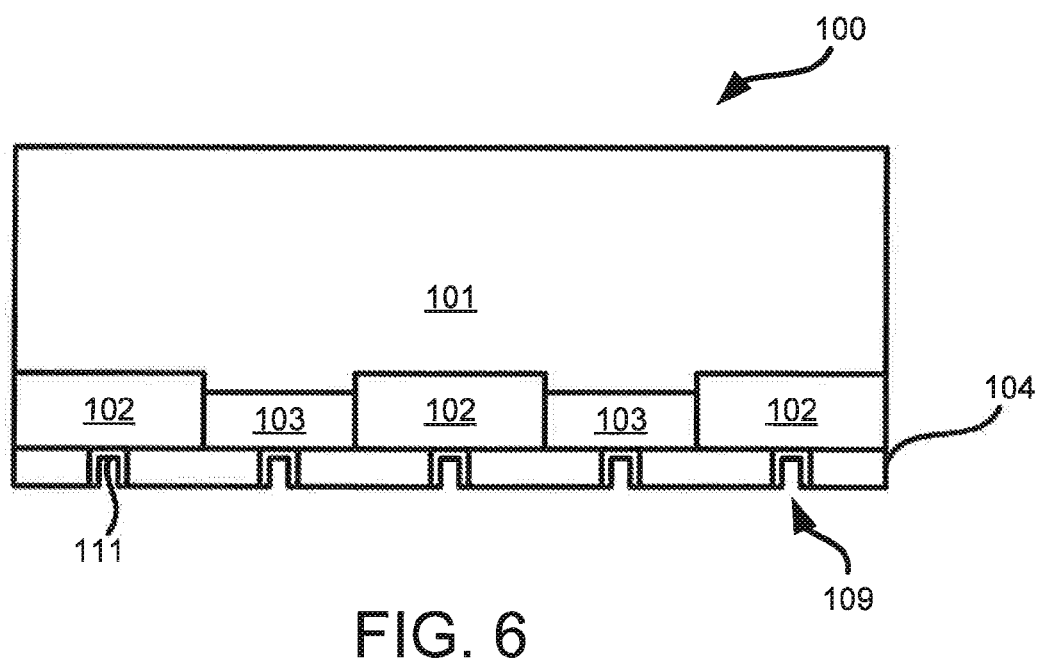

Some or the majority of the blanket metal layer 110 is removed in FIG. 6. Metal layers 111 remain in the openings 109 of the dielectric layer 104 after this removal. In one instance, a dielectric etch is performed that etches the dielectric layer 104 and, consequently, lifts off the blanket metal layer 110 that is disposed on the surface of the dielectric layer 104. This further reduces the thickness of the dielectric layer 104, but the n-type regions 103 and p-type regions 102 may not be affected. Controlling the temperature during this dielectric etch may increase removal of the blanket metal layer 110 to form the metal layers 111. Of course, other methods that remove part of the blanket metal layer 110 also may be used. While FIG. 6 illustrates metal layers 111 remaining on all the walls of the openings 109, the metal layers 111 may only remain on the n-type regions 103 and p-type regions 102 in the openings 109. Thus, the metal layers 111 may only be on the bottom of the openings 109.

Figure 7:
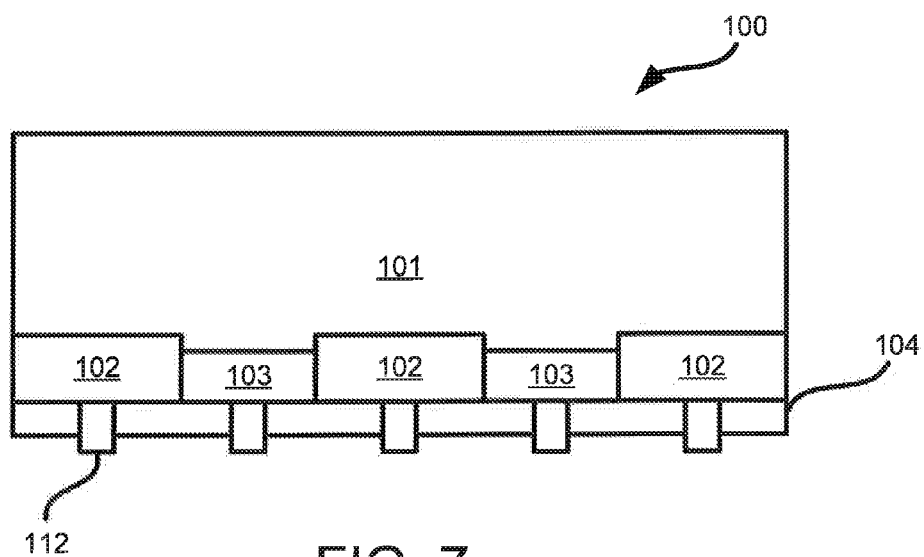

In FIG. 7, a metallization process occurs. Metal contacts 112 are formed on the n-type regions 103 and p-type regions 102 using the metal layers 111 from FIG. 6. The metal layers 111 may be used as a seed in one instance. The metal contacts 112 may be formed by, for example, PVD, screen printing, evaporation, or electroplating.

In an alternate embodiment, a tunnel oxide layer is deposited after the dielectric layer 104 is etched, but before the blanket metal layer 110 is formed. This may passivate at the interface between the metal and silicon.

In another alternate embodiment, no blanket metal layer 110 is applied. Instead, the metallization process to form the metal contacts 112 occurs without forming a seed in the openings 109. This may use screen printing or an electroless or displacement plating method.

In yet another alternate embodiment, a seed is implanted into the n-type regions 103 and p-type regions 102 in the openings 109. A metal species, such as Ni or Ti, may be implanted in this embodiment. The metal contacts 112 use the implanted seed during the metallization process. In one particular instance, the metal species is used to amorphize the dielectric layer 104 and is implanted through the dielectric layer 104 into the n-type regions 103 and p-type regions 102. Thus, a region of the n-type regions 103 and p-type regions 102 may contain the metal seed used during the metallization process. Such an implant also amoiphizes the dielectric layer 104 and can be used to form the openings 109.

Figure 8:
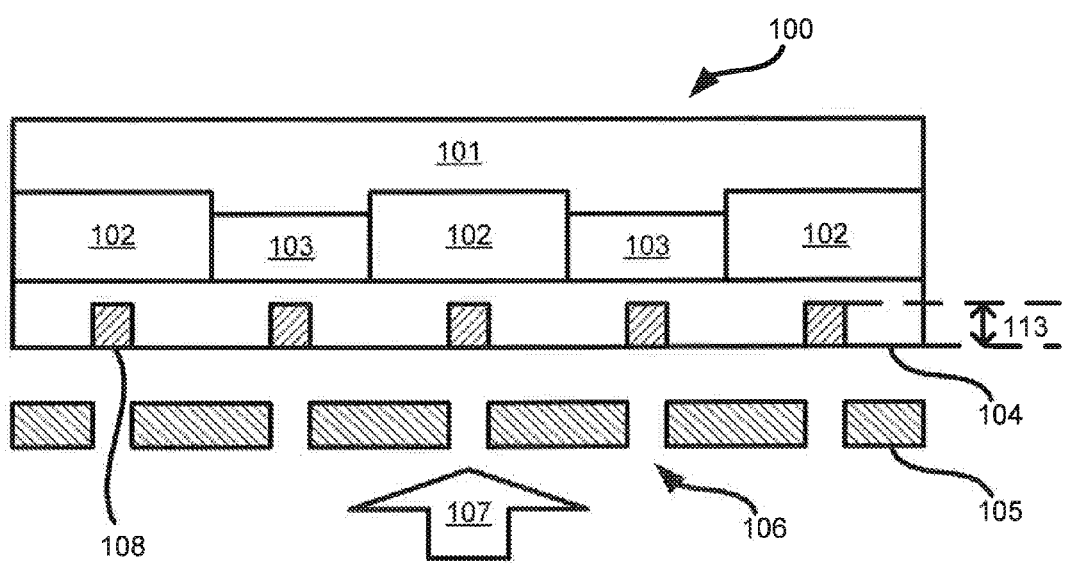
FIG. 8 is a cross-sectional view of a first embodiment of implanted regions formed in a dielectric layer.

FIG. 8 is a cross-sectional view of a first embodiment of implanted regions formed in a dielectric layer. The implanted regions 108 have an implant depth 113. In one instance, this implant depth 113 is less than the total thickness of the dielectric layer 104. The implant depth 113 may be configured to accelerate the etching of the dielectric layer 104 enough to cause the formation of the openings 109.

Figure 9:
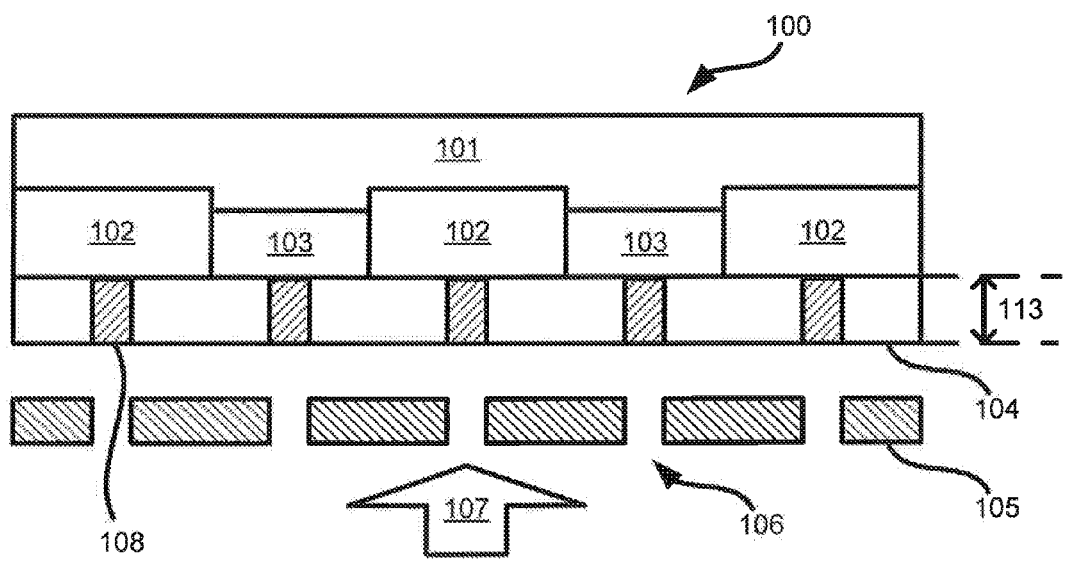
FIG. 9 is a cross-sectional view of a second embodiment of implanted regions formed in a dielectric layer.

FIG. 9 is a cross-sectional view of a second embodiment of implanted regions formed in a dielectric layer. In this embodiment, the implant depth 113 is approximately equal to the thickness of the dielectric layer 104. This particular implant depth 113 may increase the speed at which the etch is completed because the implanted regions 108 will preferentially etch compared with the rest of the dielectric layer 104. This implant depth 113 of FIG. 9 also may increase the total thickness of the dielectric layer 104 left after the etching because less of the dielectric layer 104 is lost if the etch is completed at a faster rate. This embodiment also may enable a thinner dielectric layer 104 to be used because less of the dielectric layer 104 will be lost, which decreases the time and cost to form the dielectric layer 104.

Figure 10:
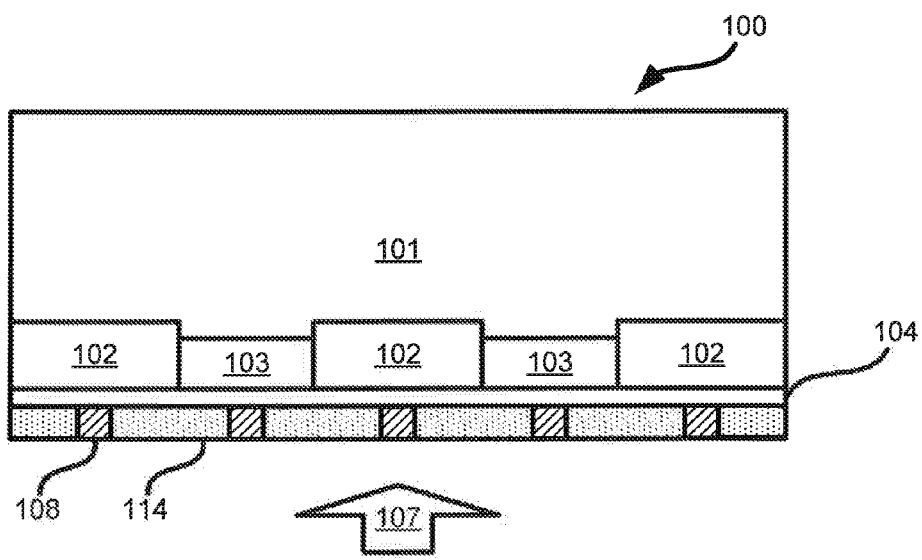
FIG. 10 is a cross-sectional view of a second embodiment of patterned implantation.

FIG. 10 is a cross-sectional view of a second embodiment of patterned implantation. In this embodiment, the ions 107 are implanted into the dielectric layer 104 form the implanted regions 108 without use of a mask. The solar cell 100 and the ion beam may be moved or scanned with respect to each other at a variable rate such that the implanted regions 108 have an increased dose. Thus, the dwell time of the ions 107 may be higher in the implanted regions 108 than elsewhere in the dielectric layer 104. This method may result in a blanket dose of ions 107 elsewhere in the surface of the dielectric layer 104, forming the secondary implanted regions 114 (filled with dots in FIG. 10) between or adjacent to the implanted regions 108. The secondary implanted regions 114 will have less dose that in the implanted regions 108. The secondary implanted regions 114 may be at least partly etched away during formation of the openings. The secondary implanted regions 114 may etch at a slower rate than the implanted regions 108 because the secondary implanted regions 114 have a lower dose. In the alternative, the solar cell 100 and the ion beam are moved or scanned with respect to each other at a constant rate but the implant dose is varied to form the implanted regions 108. This likewise results in implanted regions 108 with a higher dose than the secondary implanted regions 114.

Figure 11:
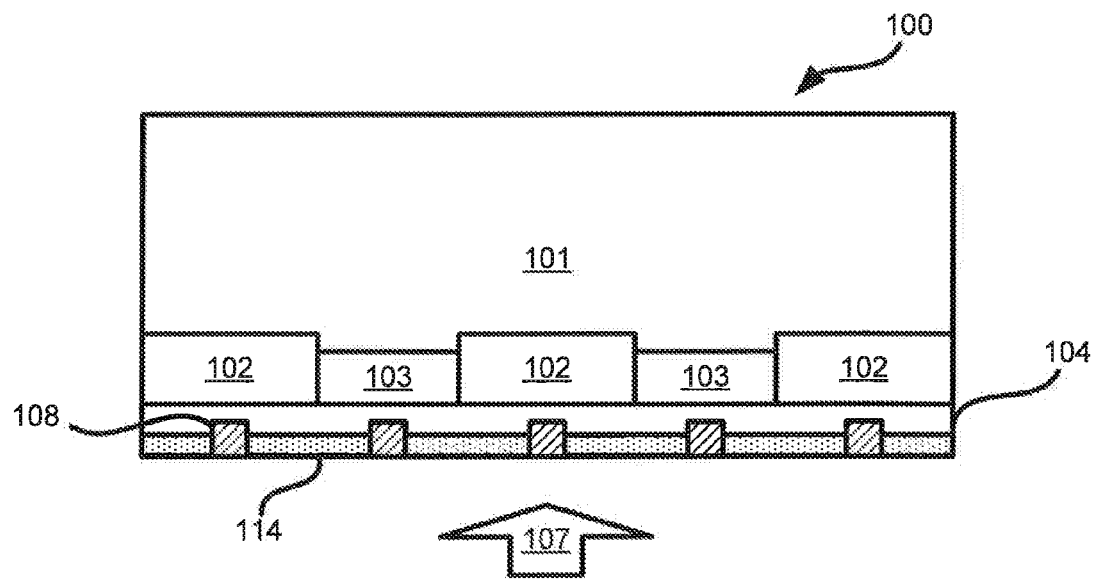
FIG. 11 is a cross-sectional view of a third embodiment of patterned implantation.

FIG. 11 is a cross-sectional view of a third embodiment of patterned implantation. In this embodiment, the ions 107 are implanted to form the implanted regions 108 without use of a mask. The solar cell 100 and the ion beam may be moved or scanned with respect to each other at a constant rate but the implant energy is varied to form the implanted regions 108 with a deeper implant depth than the secondary implanted regions 114. Both the implanted regions 108 and the secondary implanted regions 114, which may have approximately equal doses, may be partly or totally etched away during formation of the openings. Of course, the implanted regions 108 and secondary implanted region 114 may have different doses if the scan rate or dose is varied during implantation.

While the implanted regions 108 and secondary implanted regions 114 are illustrated in FIGS. 10-11 as separate, the implanted regions 108 and secondary implanted regions 114 may be continuous across the dielectric layer 104. The difference between the implanted regions 108 and secondary implanted regions 114 may be the dose or implant depth.

Figure 12:
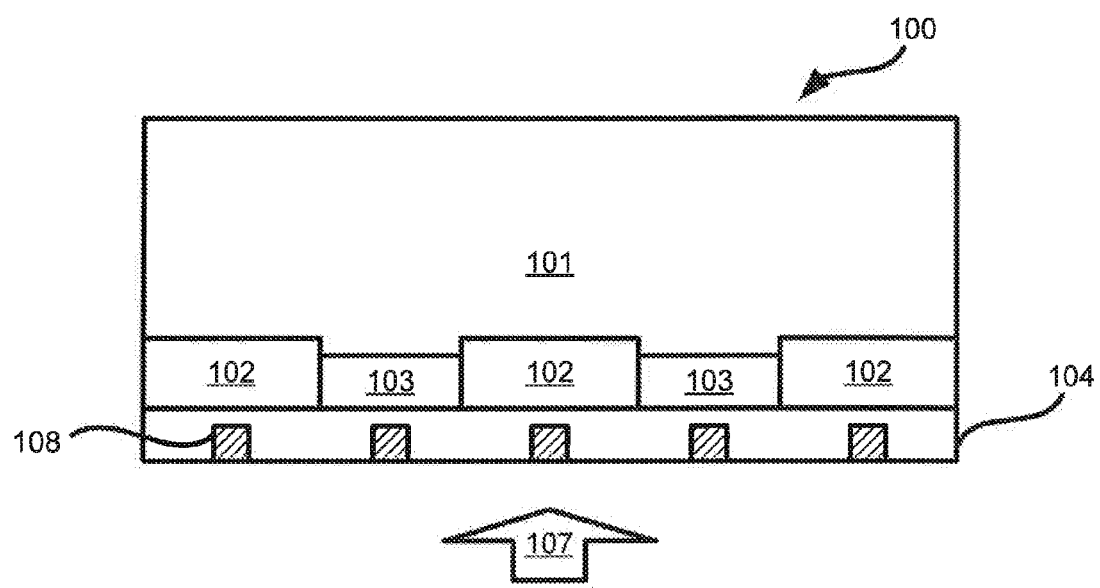
FIG. 12 is a cross-sectional view of a fourth embodiment of patterned implantation.

FIG. 12 is a cross-sectional view of a fourth embodiment of patterned implantation. In this embodiment, the ions 107 are implanted to form the implanted regions 108 without use of a mask. The ions 107 are blocked or the ion beam is turned off while the solar cell 100 and the ion beam are moved or scanned with respect to each other. This results in formation of the implanted regions 108 without implanting the rest of the dielectric layer 104. In an alternate embodiment, the solar cell 100 is fixed with respect to an ion beam containing the ions 107. This ion beam is focused, consists of multiple ion beams, or has beamlets configured to form the implanted regions 108. The implanted regions 108 may be formed in one or more implants per solar cell using this method.

Figure 13:
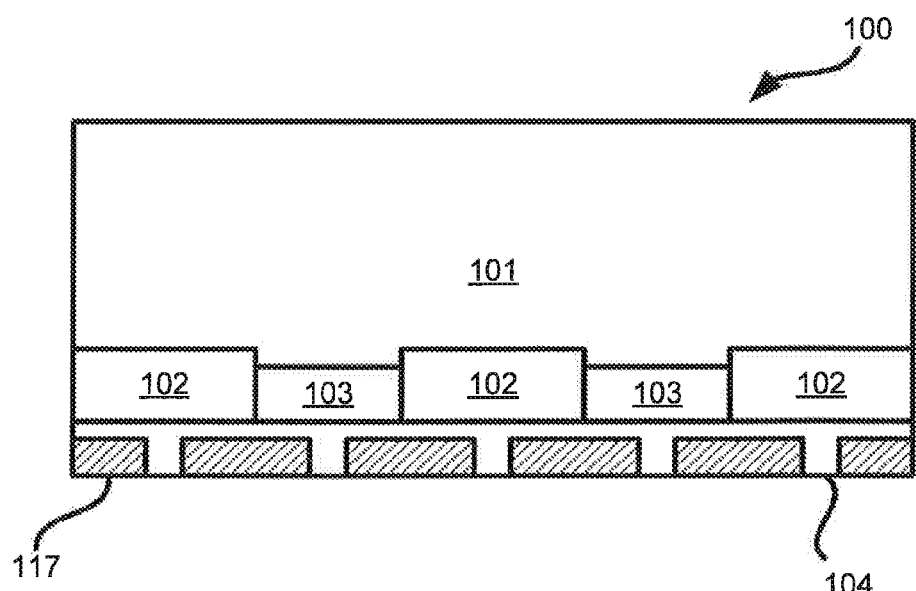
FIG. 13 is a cross-sectional view of a fifth embodiment of patterned implantation.

FIG. 13 is a cross-sectional view of a fifth embodiment of patterned implantation. In this embodiment, the implanted regions 117 are implanted with a species that causes the implanted regions 117 to etch slower than the rest of the dielectric layer 104. The implanted regions 117 may be to a depth that equal to or less than the thickness of the dielectric layer 104. In one instance, the dielectric layer 104 is an oxide and the implanted regions 108 of FIG. 13 may be implanted with N. This N implant may convert the implanted regions 117 from an oxide to an oxynitride. Oxynitrides may etch slower than an oxide. Other species also may be implanted into the dielectric layer 104 to cause the implanted regions 117 to etch slower.

If the implanted regions 117 etch slower, then during an etch, such as that illustrated in FIG. 4, the non-implanted regions of the dielectric layer 1.04 will preferentially etch compared to the implanted regions 117. Thus, the openings 109 may be formed between the implanted regions 117. If the dielectric layer 104 is rendered more resistant to etch due to the implant that forms the implanted regions 117, then the dielectric layer 104 may be made thinner compared with, for example, the embodiment of FIG. 3 because less of the dielectric layer 104 will be lost during the etch.

Figure 14:
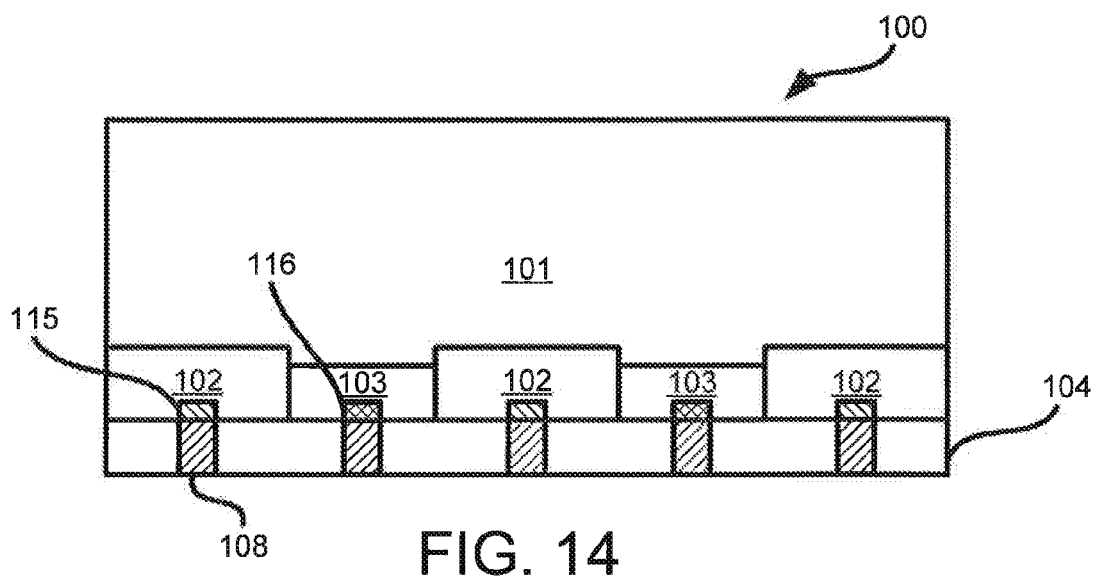
FIG. 14 is a cross-sectional view of a sixth embodiment of patterned implantation.

FIG. 14 is a cross-sectional view of a sixth embodiment of patterned implantation. In this embodiment, implanted regions 108 are formed using two implants. The ions that form the implanted regions 108 are implanted deeper than the dielectric layer and form the implanted regions 115, 116 in the p-type regions 102 and n-type regions 103. A p-type dopant is implanted to form the implanted regions 115 in the p-type regions 102. An n-type dopant is implanted to form the implanted regions 116 in the n-type regions 103. Thus, the implanted regions 108 are implanted with a species having a conductivity corresponding to the adjacent implanted region 115 or implanted region 116. This will provide extra dopant under the resulting metal contacts, which may improve cell efficiency and charge collection. Two or more implants may be needed in this embodiment.

In one particular embodiment, some of the steps involved in the embodiments disclosed herein may be performed in a single processing tool or may be performed without breaking vacuum. This increases throughput. For example, the patterned implant in FIG. 1, formation of the dielectric layer in FIG. 2, and patterned implant into the dielectric layer of FIG. 3 may be performed in a single system. This system may be a cluster tool with to multiple process chambers or a system with a single process chamber. For example, a cluster tool may include one or more ion implanters to perform the patterned implants of FIGS. 1 and 3 and a plasma system that deposits the dielectric of FIG. 2. If a single system with one chamber is used, this may enable in-situ alignment of the various doped regions and openings in the dielectric layer.

The embodiments disclosed herein avoid a lithography or screen print step to form a mask and also may avoid a cleaning step. Furthermore, the etch step may be simplified. This increases throughput and reduces manufacturing costs.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of manufacturing a workpiece comprising:
    forming a dielectric layer over a doped region of a workpiece wherein said doped region comprises a plurality of n-type regions and a plurality of p-type regions;
    performing a patterned implant into said dielectric layer whereby a plurality of implanted regions are formed, wherein said patterned implant comprises implanting an n-type dopant and a p-type dopant whereby said n-type dopant is implanted through said dielectric layer into said plurality of n-type regions and said p-type dopant is implanted through said dielectric layer into said plurality of p-type regions;
    selectively etching said dielectric layer to form a plurality of openings, wherein said doped region of said workpiece is exposed through said plurality of said openings; and
    applying a metal layer to said doped region through said openings.

2. The method of claim 1, wherein said dielectric layer is selected from the group consisting of an oxide, a nitride, and amorphous silicon.

3. The method of claim 1, wherein said plurality of implanted regions correspond to said plurality of openings.

4. The method of claim 1, further comprising disposing a mask defining a plurality of apertures a distance from said workpiece prior to said patterned implant, wherein said implanted regions are formed through said apertures.

5. The method of claim 1, further comprising forming at least one secondary implanted region between two of said plurality of implanted regions, wherein said secondary implanted region is etched during said selectively etching.

6. The method of claim 1, wherein said workpiece is a solar cell.

7. A method of manufacturing a solar cell comprising:
    implanting a solar cell to form a plurality of n-type regions;
    implanting said solar cell to form a plurality of p-type regions;
    forming a dielectric layer over said n-type regions and said p-type regions;
    performing a patterned implant into said dielectric layer whereby a plurality of implanted regions are formed;
    selectively etching said plurality of implanted regions to form a plurality of openings, wherein at least one of said n-type regions and at least one of said p-type regions of said solar cell are exposed through said plurality of said openings; and
    applying metal contacts to at least one of said n-type regions and at least one of said p-type regions through said openings.

8. The method of claim 7, wherein said dielectric layer is selected from the group consisting of an oxide, a nitride, and amorphous silicon.

9. The method of claim 7, further comprising disposing a mask defining a plurality of apertures a distance from said solar cell prior to said patterned implant, wherein said implanted regions are formed through said apertures.

10. The method of claim 7, wherein said implanted regions have an implant depth and said dielectric layer has a thickness, and wherein said implant depth is less than said thickness.

11. The method of claim 7, wherein said dielectric layer has a first density and said implanted regions have a second density, and wherein said second density is higher than said first density.

12. The method of claim 7, further comprising forming at least one secondary implanted region between two of said plurality of implanted regions, wherein said secondary implanted region is etched during said selectively etching.

13. A method of manufacturing a solar cell comprising:
    implanting a solar cell to form a plurality of n-type regions;
    implanting said solar cell to form a plurality of p-type regions;
    forming a dielectric layer over said n-type regions and said p-type regions;
    performing a patterned implant into said dielectric layer whereby a plurality of implanted regions are formed;
    selectively etching said plurality of implanted regions to form a plurality of openings, wherein at least one of said n-type regions and at least one of said p-type regions of said solar cell are exposed through said plurality of said openings;
    forming a blanket metal layer over said dielectric layer and in said openings;
    removing a portion of said blanket metal layer from said dielectric layer such that said blanket metal layer remains in said openings; and
    forming metal contacts on said blanket metal layer in said openings.

14. The method of claim 13, wherein said dielectric layer is selected from the group consisting of an oxide, a nitride, and amorphous silicon.

15. The method of claim 13, further comprising disposing a mask defining a plurality of apertures a distance from said solar cell prior to said patterned implant, wherein said implanted regions are formed through said apertures.

16. The method of claim 13, wherein said implanted regions have an implant depth and said dielectric layer has a thickness, and wherein said implant depth is less than said thickness.

17. The method of claim 13, wherein said dielectric layer has a first density and said implanted regions have a second density, and wherein said second density is higher than said first density.

18. The method of claim 13, further comprising forming at least one secondary implanted region between two of said plurality of implanted regions, wherein said secondary implanted region is etched during said selectively etching.

* * * * *